United States Patent
Utsumi et al.

(10) Patent No.: US 10,319,824 B2
(45) Date of Patent: Jun. 11, 2019

(54) SEMICONDUCTOR DEVICE INCLUDES A SUBSTRATE HAVING A BANDGAP WIDER THAN THAT OF SILICON AND METHOD OF MANUFACTURING SEMICONDUCTOR DEVICE

(71) Applicant: FUJI ELECTRIC CO., LTD., Kawasaki-shi, Kanagawa (JP)

(72) Inventors: Makoto Utsumi, Tsukuba (JP); Akimasa Kinoshita, Matsumoto (JP); Yasuhiko Oonishi, Matsumoto (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 0 days.

(21) Appl. No.: 15/716,919

(22) Filed: Sep. 27, 2017

(65) Prior Publication Data
US 2018/0097079 A1 Apr. 5, 2018

(30) Foreign Application Priority Data
Oct. 5, 2016 (JP) ................................. 2016-197608

(51) Int. Cl.
*H01L 29/423* (2006.01)
*H01L 29/16* (2006.01)
(Continued)

(52) U.S. Cl.
CPC ...... *H01L 29/4236* (2013.01); *H01L 29/0623* (2013.01); *H01L 29/1095* (2013.01);
(Continued)

(58) Field of Classification Search
CPC ............. H01L 29/4236; H01L 29/7395; H01L 29/7813; H01L 29/66734; H01L 29/1608;
(Continued)

(56) References Cited

U.S. PATENT DOCUMENTS

2011/0018004 A1 1/2011 Shimizu et al.
2011/0254010 A1* 10/2011 Zhang ................. H01L 29/0623
257/66
(Continued)

FOREIGN PATENT DOCUMENTS

JP 2011-023675 A 2/2011
JP 4678902 B2 4/2011

*Primary Examiner* — Khiem D Nguyen
(74) *Attorney, Agent, or Firm* — Rabin & Berdo, P.C.

(57) ABSTRACT

A MOS gate is provided on a front surface side of a silicon carbide substrate. The silicon carbide substrate includes silicon carbide layers sequentially formed on an $n^+$-type starting substrate by epitaxial growth. Of the silicon carbide layers, a $p^+$-type silicon carbide layer is a $p^+$-type high-concentration base region and is separated into plural regions by a trench. A p-type silicon carbide layer among the silicon carbide layers covers the $p^+$-type silicon carbide layer and is embedded in the trench. A p-type silicon carbide layer among the silicon carbide layers is a p-type base region. From a substrate front surface, a gate trench penetrates the p-type base region in the trench and the $n^+$-type source region to reach an $n^-$-type drift region. Between the $p^+$-type high-concentration base region and a gate insulating film at a sidewall of the gate trench, the p-type base region is embedded in the trench.

11 Claims, 7 Drawing Sheets

(51) Int. Cl.
  *H01L 29/66* (2006.01)
  *H01L 29/78* (2006.01)
  *H01L 29/739* (2006.01)
  *H01L 29/06* (2006.01)
  *H01L 29/10* (2006.01)

(52) U.S. Cl.
  CPC .... *H01L 29/1608* (2013.01); *H01L 29/66068* (2013.01); *H01L 29/66734* (2013.01); *H01L 29/7397* (2013.01); *H01L 29/7813* (2013.01)

(58) Field of Classification Search
  CPC ............. H01L 29/1095; H01L 29/7397; H01L 29/1004–1008; H01L 29/7825; H01L 29/66621; H01L 29/42356
  See application file for complete search history.

(56) References Cited

U.S. PATENT DOCUMENTS

| | | | |
|---|---|---|---|
| 2012/0049202 A1* | 3/2012 | Nakano | H01L 29/7813 257/77 |
| 2012/0248462 A1* | 10/2012 | Wada | H01L 29/4236 257/77 |
| 2013/0341643 A1* | 12/2013 | Kudou | H01L 29/66068 257/77 |
| 2015/0048382 A1* | 2/2015 | Takeuchi | H01L 29/4236 257/77 |
| 2015/0162432 A1* | 6/2015 | Kumagai | H01L 29/0684 257/77 |
| 2015/0333175 A1* | 11/2015 | Kiyosawa | H01L 29/6606 257/77 |

* cited by examiner

SEMICONDUCTOR DEVICE INCLUDES A SUBSTRATE HAVING A BANDGAP WIDER THAN THAT OF SILICON AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2016-197608, filed on Oct. 5, 2016, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Conventionally, among vertical metal oxide semiconductor field effect transistors (MOSFETs), two widely known MOS gate structures include a planar gate structure in which a MOS gate is provided in a plate-like shape on a semiconductor substrate and a trench gate structure in which a MOS gate is formed embedded in a trench in a semiconductor substrate.

In a trench gate structure, a channel is formed perpendicular to the substrate front surface, enabling the cell width to be reduced to a greater extent as compared to a planar gate structure in which a channel is formed parallel to the substrate front surface. In addition the cell density per unit area may be further increased. Therefore, generally, by using a trench gate structure in a MOSFET, the current density per unit area may be increased, making it easy to meet demands for large currents.

Further, silicon carbide (SiC) has a bandgap that is about 3 times larger than that of silicon (Si) and a dielectric breakdown field strength that is nearly 10 times higher than that of silicon. Conventionally, although silicon is widely used as a material of a semiconductor device, the use of silicon carbide in a semiconductor device is effective for surpassing the capability of a semiconductor device that uses silicon.

When silicon carbide (SiC) is used as a semiconductor material of a MOSFET and a MOS gate is formed, the adverse effects of residual carbon (C) near the channel and crystal defects in the silicon carbide significantly reduce channel mobility as compared to a case in which silicon (Si) is used. As a result, channel resistance increases, reducing the superiority of silicon carbide over silicon. Measures such as shortening the channel length or lowering the impurity concentration of a portion of a p-type base region along the trench sidewall where the channel is formed may be taken to reduce channel resistance.

When the channel length is shortened, the distance between the drift region and the source region decreases and as a result, punchthrough (a phenomenon in which current flows between the drain and source when no gate voltage is applied) and decreased breakdown voltage are concerns. Further, when the impurity concentration of the base region is lowered, there is concern that the gate threshold voltage may decrease and when gate voltage is applied, a depletion layer (channel) of majority carriers in the base region may easily spread from a boundary of the gate insulating film and the base region, reducing the breakdown voltage. The breakdown voltage is the voltage limit that does not cause errant operation or breakdown of an element.

An n-channel type MOSFET has been proposed as a vertical MOSFET having a trench gate structure using silicon carbide. In the n-channel type MOSFET, the channel resistance is reduced by providing an n-type region having high electron mobility, along a trench inner wall (e.g., refer to Japanese Patent No. 4678902 (paragraph 0032, FIG. 1)). In Japanese Patent No. 4678902, a portion of a p-type base region along a trench sidewall and determining the gate threshold voltage is inverted to an n-type whereby the channel resistance is reduced.

A further device has been proposed as a vertical MOSFET having a trench gate structure using silicon carbide. In the device, the width of a p-type base region between adjacent trenches is reduced and the impurity concentration is lowered (e.g., refer to Japanese Laid-Open Patent Publication No. 2011-023675 (paragraphs 0033 to 0034, FIGS. 1 to 3)). In Japanese Laid-Open Patent Publication No. 2011-023675, the width of the p-type base region is reduced whereby a spread of a depletion layer of majority carriers is suppressed thereby suppressing decreases in the breakdown voltage.

SUMMARY OF THE INVENTION

According to one aspect of the present invention, a semiconductor device includes a semiconductor substrate containing a wide bandgap semiconductor material having a bandgap wider than that of silicon; a first semiconductor layer of a first conductivity type provided on a front surface of the semiconductor substrate and containing the wide bandgap semiconductor material; a second semiconductor layer of a second conductivity type provided on a surface on a first side of the first semiconductor layer opposite a second side of the first semiconductor layer facing the semiconductor substrate, the second semiconductor layer containing the wide bandgap semiconductor material; a first groove penetrating both surfaces of the second semiconductor layer in a thickness direction and reaching the first semiconductor layer; a third semiconductor layer of the second conductivity type provided on a surface on a first side of the second semiconductor layer opposite a second side of the second semiconductor layer facing the first semiconductor layer, the third semiconductor layer further embedded in the first groove, an impurity concentration of the third semiconductor layer lower than that of the second semiconductor layer, the third semiconductor layer containing the wide bandgap semiconductor material; a first semiconductor region of the first conductivity type selectively provided in the third semiconductor layer; a trench penetrating, in the thickness direction, the third semiconductor layer in the first groove and the first semiconductor region to reach the first semiconductor layer, a width of the trench narrower than that of the first groove; a gate insulating film provided along an inner wall of the trench; a gate electrode provided on the gate insulating film in the trench; a first electrode electrically connected to the first semiconductor region and the third semiconductor layer; and a second electrode electrically connected to a rear surface of the semiconductor substrate;

In the semiconductor device, the second semiconductor layer faces, across the third semiconductor layer, the gate insulating film provided along the sidewall of the trench.

The semiconductor device includes a second groove provided at a predetermined depth from the surface on the first side of the first semiconductor layer in the thickness direction, a width of the second groove wider than that of the first groove. The second semiconductor layer is embedded in the second groove. The first groove penetrates the second semiconductor layer in the second groove, in the thickness direction, from the surface on the first side of the second semiconductor layer and reaches the first semiconductor layer.

The semiconductor device includes a second semiconductor region of the second conductivity type provided in the first semiconductor layer separately from the second semiconductor layer and the third semiconductor layer, the second semiconductor region covering at least a portion of a bottom of the trench, an impurity concentration of the second semiconductor region higher than that of the third semiconductor layer.

In the semiconductor device, the second semiconductor layer is an epitaxial layer.

In the semiconductor device, the third semiconductor layer is an epitaxial layer.

In the semiconductor device, the wide bandgap semiconductor material is silicon carbide.

A method of manufacturing a semiconductor device includes depositing a first epitaxial layer of a first conductivity type on a front surface of a semiconductor substrate containing a semiconductor material having a bandgap wider than that of silicon; depositing a second epitaxial layer of a second conductivity type on the first epitaxial layer; forming a first groove penetrating both surfaces of the second epitaxial layer in a thickness direction and reaching the first epitaxial layer; depositing a third epitaxial layer of the second conductivity type on the second epitaxial layer and in the first groove, an impurity concentration of the third epitaxial layer lower than that of the second epitaxial layer; selectively forming a first semiconductor region of the first conductivity type in the third epitaxial layer; forming a trench penetrating, in the thickness direction, the first semiconductor region and the third epitaxial layer in the first groove and reaching the first epitaxial layer, a width of the trench narrower than that of the first groove; forming a gate insulating film along an inner wall of the trench; forming a gate electrode on the gate insulating film in the trench; forming a first electrode electrically connected to the first semiconductor region and the third epitaxial layer; and forming a second electrode electrically connected to a rear surface of the semiconductor substrate.

The method of manufacturing a semiconductor device includes forming a second groove after depositing the first epitaxial layer and before depositing the second epitaxial layer. The second groove is formed in the first epitaxial layer at a predetermined depth in the thickness direction. A width of the second groove is wider than that of the first groove. The second epitaxial layer is deposited in the second groove. The first groove is formed to penetrate, in the thickness direction, the second epitaxial layer in the second groove from a surface of the second epitaxial layer and reach the first epitaxial layer.

The method of manufacturing a semiconductor device includes forming a second semiconductor region of the second conductivity type after depositing the first epitaxial layer and before depositing the second epitaxial layer. The second semiconductor region is formed in the first epitaxial layer. An impurity concentration of the second semiconductor region is higher than that of the third epitaxial layer. The trench is formed so that at least a portion of a bottom of the trench reaches the second semiconductor region.

In the method of manufacturing a semiconductor device, the semiconductor material having a bandgap wider than that of silicon is silicon carbide.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
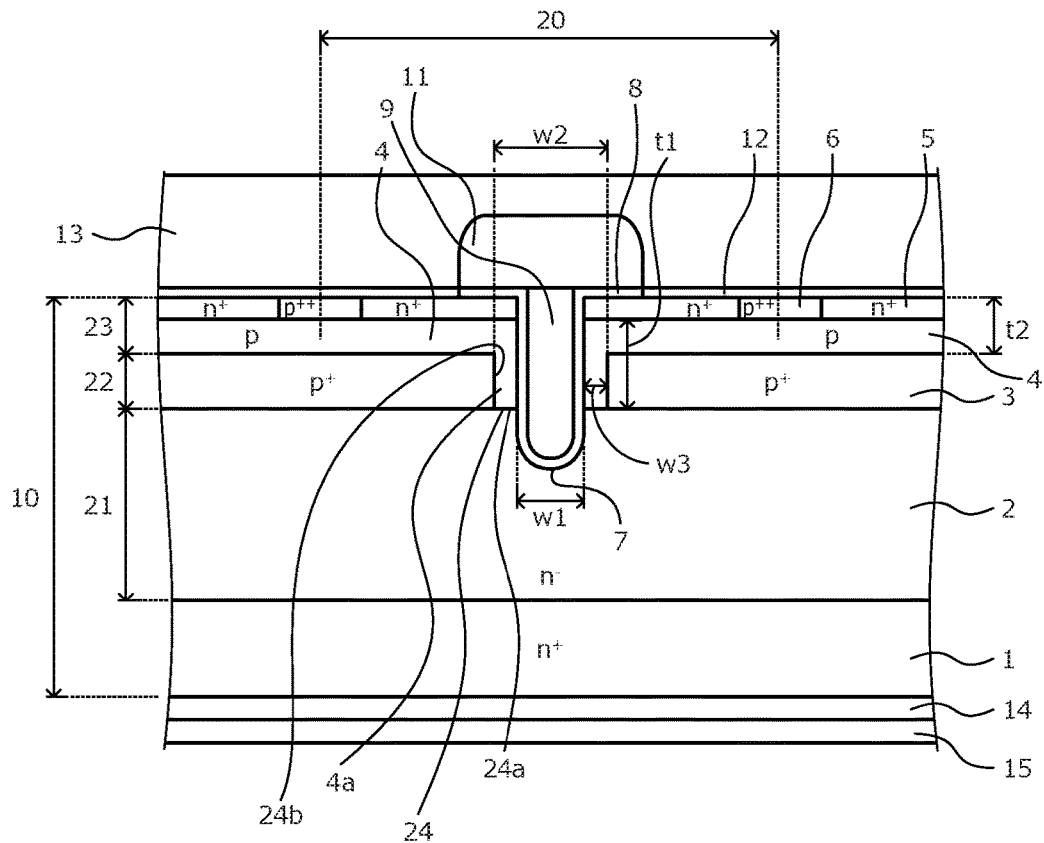
FIG. 1 is a cross-sectional view of a structure of a semiconductor device according to a first embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

The semiconductor device according to the present invention is configured using a semiconductor material (hereinafter, wide bandgap semiconductor) having a bandgap that is wider than that of silicon (Si). Here, a structure of the semiconductor device according to a first embodiment will be described taking, as an example, an enhancement mode (normally-off) vertical MOSFET (hereinafter, SiC-vertical MOSFET) produced (manufactured) using silicon carbide (SiC) as a wide bandgap semiconductor material. While silicon carbide is one example of a wide bandgap semiconductor, embodiments of the invention include any wide bandgap semiconductor, including silicon dioxide, aluminum nitride, gallium nitride, boron nitride, and diamond. FIG. 1 is a cross-sectional view of a structure of the semiconductor device according to the first embodiment.

The semiconductor device according to the first embodiment depicted in FIG. 1 is a SiC-vertical MOSFET having a MOS gate of a trench gate structure on a front surface side of a silicon carbide substrate (semiconductor chip) 10. The silicon carbide substrate 10 is an epitaxial substrate in which silicon carbide layers (first to third semiconductor layers (first to third epitaxial layers)) 21 to 23 of predetermined conductivity types and impurity concentrations are sequentially formed by epitaxial growth on a front surface of an $n^+$-type starting substrate (semiconductor substrate) 1. The n+-type starting substrate 1 is an n+-type drain region. The n−-type silicon carbide layer 21 is an n−-type drift region 2. The p+-type silicon carbide layer 22 becomes a p+-type high-concentration base region 3.

In FIG. 1, one unit cell (functional unit of an element) 20 and portions of unit cells adjacent to the unit cell 20 in an active region are depicted while other unit cells, an edge termination region, etc. are not depicted. The active region is a region through which current flows in an ON state. The edge termination region is a region that surrounds a periphery of the active region and that mitigates electric field on a front surface (hereinafter, substrate front surface) side of the silicon carbide substrate 10 to maintain breakdown voltage. The breakdown voltage is the voltage limit that does not cause errant operation or breakdown of an element. In the edge termination region, a breakdown voltage structure such as a guard ring, a junction termination extension (JTE) structure, RESURF, a field plate, etc. is arranged.

In the active region, a MOS gate is provided on the substrate front surface (surface on the p-type silicon carbide layer 23 side) side. The MOS gate includes the p+-type high-concentration base region 3, a p-type base region 4, an n+-type source region (first semiconductor region) 5, a p++-type contact region 6, a trench (hereinafter, gate trench) 7, a gate insulating film 8, and a gate electrode 9. The p+-type high-concentration base region 3 is selectively provided on a surface on a first side of the n−-type drift region 2 opposite a second side of the n−-type drift region 2 facing the n+-type starting substrate 1. The p+-type high-concentration base region 3 constitutes a base region of the MOS gate. The p+-type high-concentration base region 3 is the p+-type silicon carbide layer 22 separated into plural regions by the trench (first groove) 24.

The p+-type high-concentration base region 3 has a function of suppressing a spread of a depletion layer of holes spreading in a base region (the p-type base region 4 and the p+-type high-concentration base region 3) from a boundary of the gate insulating film 8 and the p-type base region 4 when voltage equal to or higher than the gate threshold voltage is applied to the gate electrode 9 while voltage that is positive relative to a source electrode (first electrode) 12 is applied to a drain electrode (second electrode) 14. Further, the p+-type high-concentration base region 3 is formed to have a sufficiently high impurity concentration (e.g., about $1 \times 10^{16}/cm^3$ to $1 \times 10^{18}/cm^3$) and thereby has a function of mitigating a concentration of electric field at a bottom of the gate trench 7 when the MOSFET is OFF.

The trench 24 is arranged in a direction (horizontal direction) parallel to the substrate front surface, at a position that corresponds to the gate trench 7. The trench 24 penetrates through both surfaces of the p+-type silicon carbide layer 22 in a thickness direction (a direction from the substrate front surface toward a substrate rear surface: vertical direction) and reaches the n−-type drift region 2. Although FIG. 1 depicts a case in which a depth of the trench 24 is substantially a same depth as that of the p+-type silicon carbide layer 22 and a bottom 24a of the trench 24 is positioned at a depth that is substantially a same depth as that of a boundary of the p+-type silicon carbide layer 22 and n−-type silicon carbide layer 21, the depth of the trench 24 may be deeper than a thickness of the p+-type silicon carbide layer 22. In other words, the bottom 24a of the trench 24 may be positioned closer than the boundary of the p+-type silicon carbide layer 22 and the n−-type silicon carbide layer 21 to the drain region.

The p-type silicon carbide layer 23 covers the p+-type high-concentration base region 3 and is embedded in the trench 24. In other words, at the bottom 24a of the trench 24, the p-type silicon carbide layer 23 contacts the n−-type drift region 2. In a surface region on the substrate front surface side of the p-type silicon carbide layer 23, the n+-type source region 5 and the p++-type contact region 6 are each selectively provided. The n+-type source region 5 and the p++-type contact region 6 may be provided at a depth, from the substrate front surface, reaching the p+-type high-concentration base region 3. The n+-type source region 5 and the p++-type contact region 6 contact each other. The p++-type contact region 6, for example, is arranged centrally between the gate trenches 7 (mesa portion). Between centers of mesa portions is one unit cell 20.

A portion of the p-type silicon carbide layer 23 other than the n+-type source region 5 and the p++-type contact region 6 is the p-type base region 4. The p-type base region 4 constitutes the base region of the MOS gate. An impurity concentration of the p-type base region 4 is lower than an impurity concentration of the p+-type high-concentration base region 3. The channel length is determined by a thickness t1 of a portion of the p-type base region 4 between the n+-type source region 5 and the n−-type drift region 2 (i.e., a portion of the p-type base region 4 along a sidewall of the gate trench 7). Therefore, the impurity concentration of the p-type base region 4 and the thickness t1 may be designed to vary according to element. For example, the gate threshold voltage is set according to the impurity concentration of the p-type base region 4.

Further, the gate threshold voltage is adjusted by the impurity concentration of the p+-type high-concentration base region 3 and a width w3 from the sidewall of the gate trench 7 to the p+-type high-concentration base region 3. In particular, the p+-type high-concentration base region 3, as described above, has a function of suppressing the spread of a depletion layer of majority carriers (holes) spreading in the base region. In other words, the p+-type high-concentration base region 3 has function of preventing excessive spreading of the depletion layer of holes. The depletion layer of holes (region where holes have been depleted) is a channel formed in a portion of the base region along a sidewall of the gate trench 7. In a thermal equilibrium state when no gate voltage is applied, the channel includes only a small amount of minority carriers (electrons) whereby conductivity is extremely low.

On the other hand, although the channel spreads in the p-type base region 4 when positive gate voltage is applied, the spread thereof is suppressed by the p+-type high-concentration base region 3. As a result, compared to a conventional structure in which the p+-type high-concentration base region 3 is not provided, the electric field strength applied to the channel increases and a lower end of the conduction band of the semiconductor surface (channel portion of the p-type base region 4) of the MOS gate approaches the Fermi level whereby the electron density in the channel increases easily and thus, the conductivity of the channel increases easily (polarity of the channel is easily inverted to an n-type). Therefore, even when the impurity concentration of the p-type base region 4 is lowered, the polarity of the channel may be inverted to an n-type by the gate threshold voltage obtained theoretically by the impurity concentration of the p-type base region 4.

In this manner, the gate threshold voltage may be suitably set by the impurity concentration of the p-type base region 4. For example, even when the impurity concentration of the p-type base region 4 is lowered, the spread of the channel from the boundary of the gate insulating film 8 and the p-type base region 4 to inside the p-type base region 4 is suppressed by the p$^+$-type high-concentration base region 3 whereby decreases in the breakdown voltage may be prevented. Therefore, with the breakdown voltage maintained as is, the impurity concentration of the p-type base region 4 is suitably set as described above, enabling a predetermined gate threshold voltage to be set. In more detail, for example, the gate threshold voltage is determined by the impurity concentration of the p-type base region 4, the impurity concentration of the p$^+$-type high-concentration base region 3, the width w3 from the sidewall of the gate trench 7 to the p$^+$-type high-concentration base region 3, and a thickness of the gate insulating film 8.

The gate trench 7 penetrates the p-type base region 4 in the trench 24 and the n$^+$-type source region 5 from the substrate front surface, and reaches the n$^-$-type drift region 2 at the bottom 24a of the trench 24. A width of the gate trench 7 (width in a lateral direction) w1 is less than a width (width in the lateral direction) w2 of the trench 24 (w1<w2). Therefore, the p$^+$-type high-concentration base region 3 is arranged to be separate from the gate insulating film 8 of the sidewall of the gate trench 7 by the trench 24. Between the p$^+$-type high-concentration base region 3 and the gate insulating film 8 of the sidewall of the gate trench 7, the p-type base region 4 (4a) is present. In other words, the p-type base region 4 extends between the p$^+$-type high-concentration base region 3 and the gate insulating film 8 of the sidewall of the gate trench 7, along the sidewall of the gate trench 7 toward the drain region, and contacts the n$^-$-type drift region 2 at this extended portion (a portion embedded in the trench 24) 4a.

At the sidewall of the gate trench 7, the n$^+$-type source region 5, the p-type base region 4, and the n$^-$-type drift region 2 are exposed. A crystal plane of the sidewall of the gate trench 7 may be, for example, an m face. As a result, variation of MOS gate characteristics may be reduced. An m face is a general term for a (000-1) plane, i.e., a {10-10} plane perpendicular to a C plane. In particular, an m face is a (10-10) plane, a (−1010) plane, a (1-100) plane, a (−1100) plane, a (01-10) plane, and a (0-110) plane. At the bottom of the gate trench 7, the n$^-$-type drift region 2 is exposed. The crystal face at the bottom of the gate trench 7 is a Si face identical to that of the substrate front surface.

The gate trench 7, for example, is arranged in a striped (linear) planar layout extending parallel to the substrate front surface. In this case, each region between adjacent gate trenches 7 (the p$^+$-type high-concentration base region 3, the p-type base region 4, the n$^+$-type source region 5, and the p$^{++}$-type contact region 6) is also arranged in linear planar layout parallel to a direction (longitudinal direction of the gate trench 7) along which the gate trench 7 extends in a striped shape. A planar layout is a planar shape and arrangement configuration of parts as viewed from the front surface side of the silicon carbide substrate 10. A sidewall 24b of the trench 24 is arranged in a rectangular planar layout surrounding a periphery of the gate trench 7.

The gate insulating film 8 is provided along an inner wall of the gate trench 7. The thickness of a portion of the gate insulating film 8 at the bottom of the gate trench 7 may be relatively thicker than a portion of the gate insulating film 8 at a sidewall. The thickness of the portion of the gate insulating film 8 at the bottom of the gate trench 7 is thicker than the portion at the sidewall whereby the concentration of electric field at a bottom of the gate trench 7 may be mitigated. As a result, dielectric breakdown of the gate insulating film 8 at the bottom of the gate trench 7 may be suppressed, enabling decreases in the breakdown voltage to be suppressed.

The gate electrode 9 is provided on the gate insulating film 8 in the gate trench 7. The gate electrode 9 faces the n$^+$-type source region 5, the p-type base region 4, and the n$^-$-type drift region 2 across the gate insulating film 8 at the sidewall of the gate trench 7. The gate electrode 9 is electrically insulated from the n$^-$-type drift region 2, the p-type base region 4, and the n$^+$-type source region 5 by the gate insulating film 8. An end of the gate electrode 9 on the substrate front surface side may protrude outside the gate trench 7.

An interlayer insulating film 11 is provided on the entire substrate front surface from the active region and over the edge termination region, covering the gate electrode 9. The source electrode 12 contacts the n$^+$-type source region 5 and the p$^{++}$-type contact region 6 via a contact hole opened in the interlayer insulating film 11, and is electrically connected to the p-type base region 4, the p$^+$-type high-concentration base region 3, the n$^+$-type source region 5, and the p$^{++}$-type contact region 6. Further, the source electrode 12 is electrically insulated from the gate electrode 9 by the interlayer insulating film 11. Configuration may be such that the source electrode 12 is provided in only the contact hole.

A source pad (electrode pad) 13 is provided on the interlayer insulating film 11 and the source electrode 12 so as to be embedded in the contact hole. The source pad 13 electrically connects the source electrodes 12 of all the unit cells 20. On an entire rear surface (rear surface of the n$^+$-type starting substrate 1) of the silicon carbide substrate 10, a drain electrode 14 is provided. On a surface of the drain electrode 14, a drain pad (electrode pad) 15 is provided.

The method of manufacturing a semiconductor device according to the first embodiment is described. FIGS. 2, 3, 4, 5, and 6 are cross-sectional views of the semiconductor device according to the first embodiment during manufacture. First, for example, an n$^+$-type single crystal substrate doped with an n-type impurity such as nitrogen (N) is prepared as the n$^+$-type starting substrate (starting wafer) 1. The front surface of the n$^+$-type starting substrate 1 may be, for example, a (0001) plane, a so-called Si face. The n$^+$-type starting substrate 1 becomes the n$^+$-type drain region.

Next, on the front surface of the n$^+$-type starting substrate 1, for example, the n$^-$-type silicon carbide layer 21 doped with an n-type impurity such as nitrogen is formed by epitaxial growth. The n$^-$-type silicon carbide layer 21 becomes the n$^-$-type drift region 2. The thickness of the n$^-$-type silicon carbide layer 21 may be, for example, about 3 μm to 100 μm, proportional to the element breakdown voltage. For example, when the breakdown voltage is 1000V, the thickness of the n$^-$-type silicon carbide layer 21 is about 10 μm.

Figure 2:
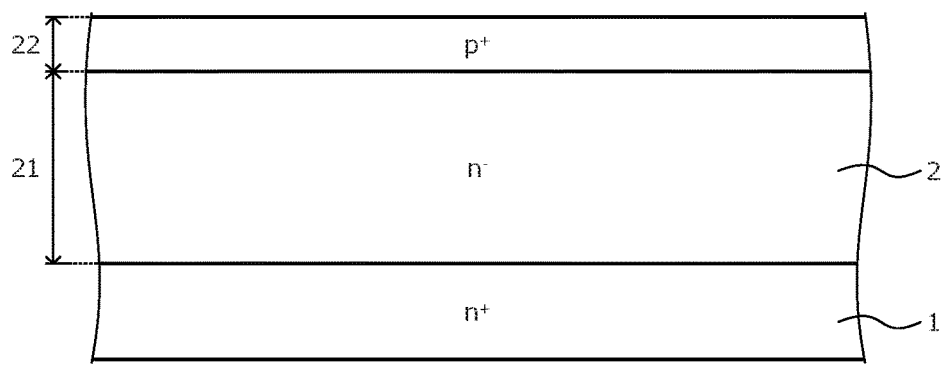
FIGS. 2, 3, 4, 5, and 6 are cross-sectional views of the semiconductor device according to the first embodiment during manufacture.

Next, on the surface of the n$^-$-type silicon carbide layer 21, for example, the p$^+$-type silicon carbide layer 22 doped with p-type impurity such as aluminum (Al) is formed by epitaxial growth. The thickness of the p$^+$-type silicon carbide layer 22 may be, for example, about 0.5 μm to 2.0 μm. An impurity concentration of the p$^+$-type silicon carbide layer 22 may be, for example, about $1 \times 10^{16}$/cm$^3$ to $1 \times 10^{18}$/cm$^3$. The state up to here is depicted in FIG. 2.

Next, an etching mask (not depicted) having an opening that corresponds to a formation region of the trench 24 is formed on the surface of the p$^+$-type silicon carbide layer 22, by a photolithography technique. As the etching mask, for example, a silicon oxide film (SiO$_2$) mask may be used. Next, etching is performed using the etching mask as a mask whereby the trench 24 is formed penetrating the p$^+$-type silicon carbide layer 22 in the thickness direction and reaching the n$^-$-type silicon carbide layer 21. This etching, for example, may be dry etching. A depth of the etching is the thickness of the p$^+$-type silicon carbide layer 22 or more.

Figure 3:
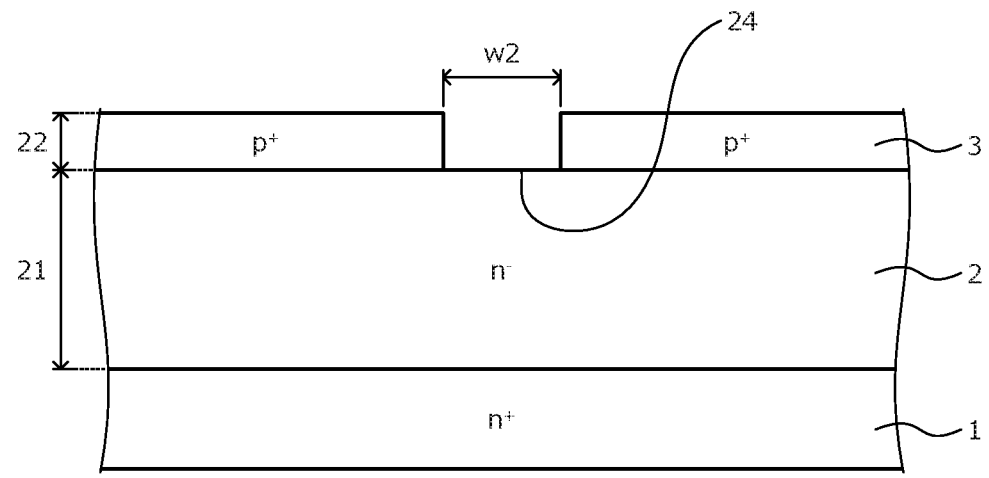

The width w2 of the trench 24 is a sum of the width w1 of the gate trench 7 formed in the trench 24 at a subsequent process and twice the thickness (corresponds to the width w3) of the p-type base region 4 remaining at the sidewall of the trench 24 after formation of the gate trench 7 (w2=w1+2×w3). The width w2 of the trench 24 may be, for example, about 1 μm to 3 μm. A portion of the p$^+$-type silicon carbide layer 22 remaining on the n$^-$-type silicon carbide layer 21 after formation of the trench 24 becomes the p$^+$-type high-concentration base region 3. The etching mask used in forming the trench 24 is removed. The state up to here is depicted in FIG. 3.

Next, on the surface of the p$^+$-type silicon carbide layer 22, for example, the p-type silicon carbide layer 23 doped with a p-type impurity such as aluminum is formed by epitaxial growth and is sufficiently embedded in the trench 24. In particular, a thickness t2 of a portion of the p-type silicon carbide layer 23 deposited on the surface of the p$^+$-type silicon carbide layer 22 is half of the width w2 of the trench 24 or more (t2≥w2/2), enabling the p-type silicon carbide layer 23 to be sufficiently embedded in the trench 24.

Figure 4:
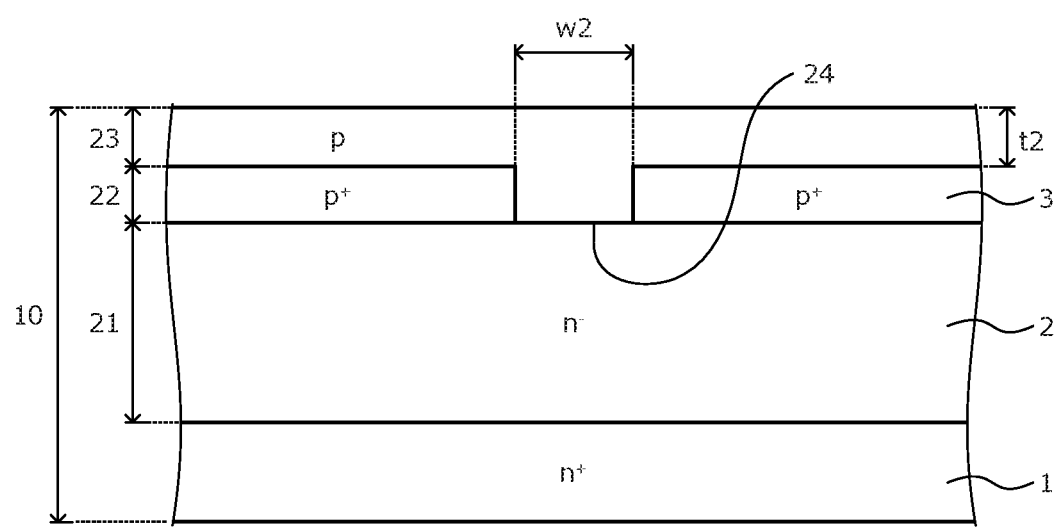

An impurity concentration of the p-type silicon carbide layer 23 is lower than the impurity concentration of the p$^+$-type silicon carbide layer 22 and is, for example, about $1 \times 10^{15}/cm^3$ or more and less than $1 \times 10^{18}/cm^3$ to satisfy a predetermined channel resistance and a predetermined breakdown voltage. By the processes up to here, the silicon carbide substrate (semiconductor wafer) 10 is produced in which the n$^-$-type silicon carbide layer 21, the p$^+$-type silicon carbide layer 22, and the p-type silicon carbide layer 23 are sequentially stacked on the front surface of the n$^+$-type starting substrate 1. The state up to here is depicted in FIG. 4.

Next, an ion implantation mask (not depicted) having an opening that corresponds to a formation region of the n$^+$-type source region 5 is formed on the front surface (the surface of the p-type silicon carbide layer 23) of the silicon carbide substrate 10, by a photolithography technique. As the ion implantation mask, for example, a silicon oxide film mask having a thickness of about 1.5 μm may be used. Next, for example, an n-type impurity such as phosphorus (P) is ion implanted using the ion implantation mask as a mask.

At this time, a dose amount of the n-type impurity ion implanted is set to be higher than the p-type impurity concentration of the p-type silicon carbide layer 23 and the conductivity type of a portion of the p-type silicon carbide layer 23 is inverted to an n-type. An implantation depth of the n-type impurity in the ion implantation may be a depth of the thickness t2 (or more) of the portion of the p-type silicon carbide layer 23 deposited on the surface of the p$^+$-type silicon carbide layer 22. As a result, the n$^+$-type source region 5 is selectively formed in the p-type silicon carbide layer 23. The ion implantation mask used in forming the n$^+$-type source region 5 is removed.

Next, an ion implantation mask (not depicted) having an opening that corresponds to a formation region of the p$^{++}$-type contact region 6 is formed on the front surface (the surface of the p-type silicon carbide layer 23) of the silicon carbide substrate 10, by a photolithography technique. As the ion implantation mask, a silicon oxide film mask having a thickness of, for example, about 1.5 μm may be used. Next, for example, a p-type impurity such as aluminum is ion implanted using the ion implantation mask as a mask.

At this time, since the p-type impurity is further ion implanted in the p-type silicon carbide layer 23, the p-type impurity concentration of a portion of the p-type silicon carbide layer 23 becomes higher. An implantation depth of the p-type impurity ion implanted may be the depth of the thickness t2 (or more) of the portion of the p-type silicon carbide layer 23 deposited on the surface of the p$^+$-type silicon carbide layer 22. As a result, the p$^{++}$-type contact region 6 is selectively formed in the p-type silicon carbide layer 23. The ion implantation mask used in forming the p$^{++}$-type contact region 6 is removed.

Figure 5:
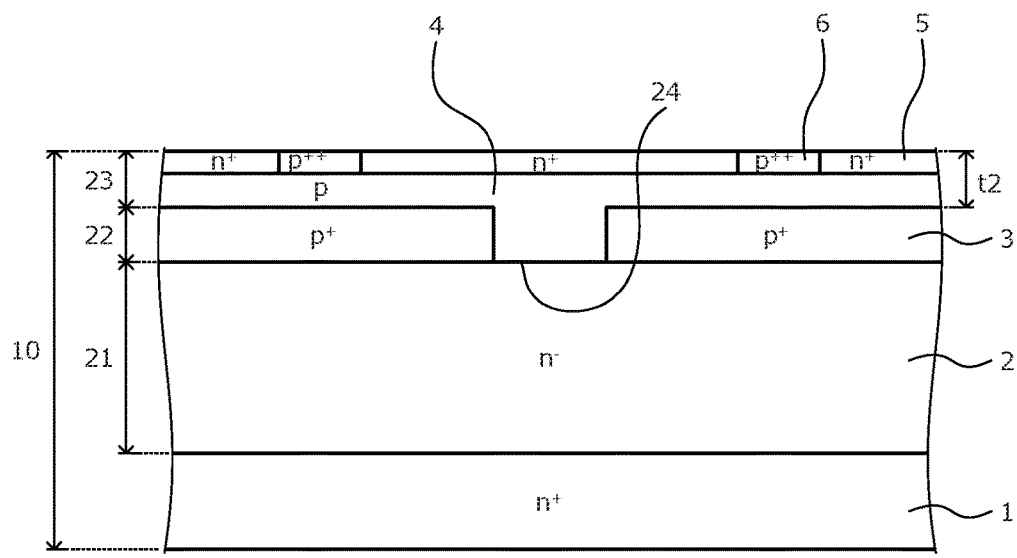

The sequence in which the n$^+$-type source region 5 and the p$^{++}$-type contact region 6 are formed may be interchanged. A portion of the p-type silicon carbide layer 23 other than the n$^+$-type source region 5 and the p$^{++}$-type contact region 6 becomes the p-type base region 4. The state up to here is depicted in FIG. 5.

Next, an etching mask (not depicted) having an opening that corresponds to a formation region of the gate trench 7 is formed on the front surface (the surface of the p-type silicon carbide layer 23) of the silicon carbide substrate 10, by a photolithography technique. As the ion implantation mask, for example, a silicon oxide film mask may be used. Next, etching is performed using the etching mask as a mask whereby the gate trench 7 is formed penetrating the n$^+$-type source region 5 and the p-type base region 4 in the trench 24, and reaching the n$^-$-type drift region 2. The etching for forming the gate trench 7, for example, may be dry etching. The depth of the gate trench 7 may be, for example, about 1.0 μm to 3.5 μm. The width w1 of the gate trench 7 may be, for example, about 0.3 μm to 2.0 μm.

Figure 6:
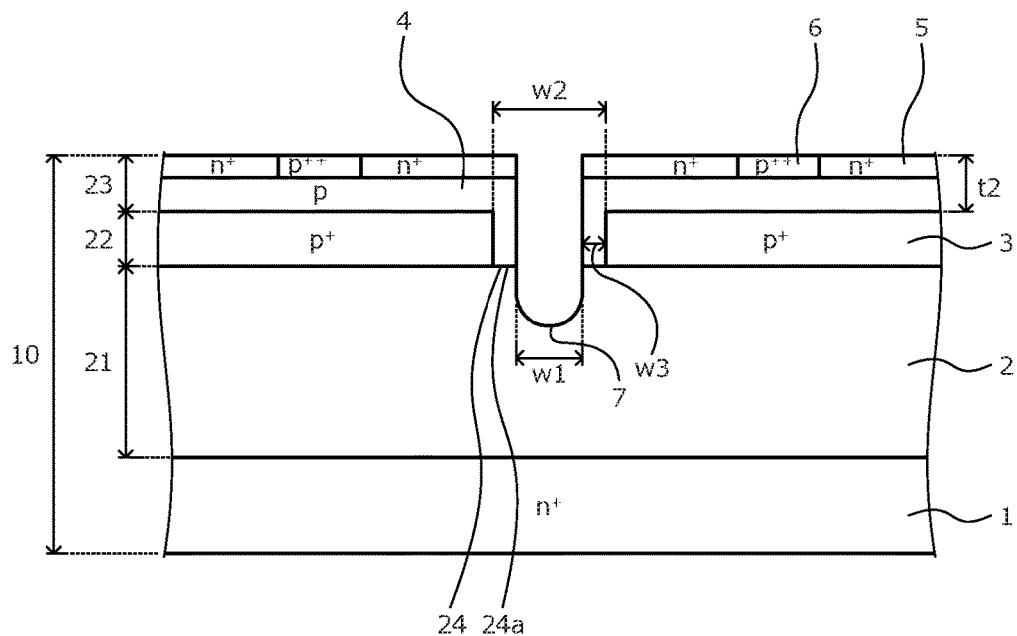

Next, the n$^+$-type source region 5 and the p$^{++}$-type contact region 6 are activated by heat treatment (activation annealing). The activation annealing may be performed, for example, at a processing temperature of about 1600 to 1800 degrees C. for a heat treating period of about 2 minutes. The activation annealing may be performed for each ion implantation session. The state up to here is depicted in FIG. 6.

Next, the gate insulating film 8 is formed on the front surface (the surfaces of the n$^+$-type source region 5 and the p$^{++}$-type contact region 6) of the silicon carbide substrate 10 and along an inner wall of the gate trench 7. The gate insulating film 8, for example, may be formed by thermal oxidation by heat treatment at a temperature of about 1000 degrees C. in an oxygen ($O_2$) atmosphere. Further, the gate insulating film 8, for example, may be a deposited oxide film deposited by a chemical reaction such as high temperature oxidation (HTO).

Next, for example, a polycrystalline silicon (poly-Si) layer doped with an n-type impurity such a phosphorus is deposited on the gate insulating film 8 so as to be embedded in the gate trench 7. The polycrystalline silicon layer is patterned by a photolithography technique, leaving a portion of the polycrystalline silicon layer to become the gate electrode 9 in the gate trench 7. A portion of the gate electrode 9 may protrude outside (from a top of) the gate trench 7.

Next, the interlayer insulating film 11 is formed so as to cover the gate insulating film 8 and the gate electrode 9. The interlayer insulating film 11 may be formed as an insulating film containing phosphorus, boron (B), etc. to improve coverage of the interlayer insulating film 11. In particular, for example, the interlayer insulating film 11 may be formed of phosphosilicate glass (PSG), borophosphosilicate glass (BPSG), or a combination thereof.

Next, the interlayer insulating film 11 and the gate insulating film 8 are patterned by a photolithography technique to form the contact hole and expose the n$^+$-type source region 5 and the p$^{++}$-type contact region 6 in the contact hole. Next, the interlayer insulating film 11 is planarized by heat treatment (reflow).

Next, as a metal film to become the source electrode 12, for example, a nickel (Ni) film is formed along the contact hole and the surface of the interlayer insulating film 11 by, for example, sputtering, etc. The metal film may be removed selectively by photolithography and etching, leaving a portion of the source electrode 12 only in the contact hole. Further, for example, as a metal film to become the drain electrode 14, a nickel (Ni) film is formed on a surface (rear surface of the n$^+$-type starting substrate 1) of the silicon carbide substrate 10 by, for example, sputtering, etc.

Next, for example, the silicon carbide substrate 10 and the metal films on both surfaces thereof (the front surface and the rear surface) are reacted by heat treatment at a temperature of 1000 degrees C. in an inert gas atmosphere, forming the source electrode 12 and the drain electrode 14 having an ohmic contact with the respective surfaces of the silicon carbide substrate 10.

Next, as a metal film to become the source pad 13, for example, an aluminum film is deposited by, for example, sputtering, etc., so as to cover the source electrode 12 and the interlayer insulating film 11, the aluminum film having a thickness of about 1 μm to 10 μm. Next, the metal film is patterned, leaving a portion to become the source pad 13.

Together with the formation of the source pad 13, a portion of the metal film may be left as a gate pad (not depicted) (electrode pad). The gate pad is electrically connected to the gate electrode 9 of each of the unit cells 20.

Next, for example, a titanium (Ti) film, nickel film, and a gold (Au) film are sequentially stacked on the surface of the drain electrode 14, by, for example sputtering, etc., forming the drain pad 15. Thereafter, the semiconductor wafer is diced (cut) into individual chips whereby the SiC-vertical MOSFET depicted in FIG. 1 is completed.

As described, according to the first embodiment, by arranging the p$^+$-type high-concentration base region to sandwich the p-type base region with the gate trench, the spread of a depletion layer (channel) of holes that spread in the base region from the boundary of the gate insulating film and the p-type base region is suppressed when positive gate voltage is applied. Therefore, when reverse voltage is applied (positive voltage is applied to the n$^-$-type drift region and negative voltage is applied to the p-type base region), punchthrough (a phenomenon in which the base region is completely depleted by the channel) at the channel may be prevented, enabling a predetermined breakdown voltage to be obtained.

Further, according to the first embodiment, since the spread of a depletion layer of holes that spread from the base region is suppressed, the interval (mesa width) between gate trenches may be reduced to an extent that punchthrough at the channel does not occur. As a result, the cell width may be reduced, enabling enhancement of the current capability or a reduction of the semiconductor chip size.

Further, according to the first embodiment, by suppressing the spread of a depletion layer of holes that spread in the base region, for example, even when the impurity concentration of the p-type base region is lowered to reduce the channel resistance, the polarity of the channel is easily inverted compared to a conventional structure in which the p$^+$-type high-concentration base region is not provided. Therefore, the MOSFET may be turned ON by a gate threshold voltage obtained theoretically by the impurity concentration of the p-type base region. Accordingly, a predetermined gate threshold voltage dependent on the impurity concentration of the p-type base region may be suitably set, enabling the ON resistance to be reduced.

Further, according to the first embodiment, even when the impurity concentration of the p-type base region is lowered to set the gate threshold voltage to a predetermined value (e.g., about 5V), since the p$^+$-type high-concentration base region is provided, the effective impurity concentration of the base region increases. Therefore, leak current and punchthrough (the phenomenon in which current flows between the drain and source when no gate voltage is applied) resulting from the short channel effect may be prevented, enabling decreases in the breakdown voltage to be suppressed.

Further, according to the first embodiment, by providing the p$^+$-type high-concentration base region between the p-type base region and the n$^-$-type drift region between gate trenches so as to be away from the gate trench, when the MOSFET is OFF, electric field concentrates more easily at the p$^+$-type high-concentration base region than at the bottom of the gate trench. Therefore, concentration of electric field at the bottom of the gate trench may be mitigated, enabling decreases in the breakdown voltage to be prevented.

For example, although a structure in which a portion of the base region is made deep so as to protrude toward the drain region may be adopted as another structure for mitigating the concentration of electric field at the bottom of the gate trench, according to the first embodiment, since the concentration of electric field at the bottom of the trench is mitigated as described above, there is no need to provide said structure. Therefore, since photolithography, ion implantation, etc. for forming said structure are not performed, the cell width may be reduced.

Further, according to the first embodiment, the p-type base region and the p$^+$-type high-concentration base region are formed by epitaxial growth whereby the p-type base region and the p$^+$-type high-concentration base region may be arranged at predetermined positions using an ordinary photolithography technique, without deviation of the position in the horizontal direction or the depth. Further according to the first embodiment, the gate trench having a narrow width is formed in the trench in which the p-type base region is embedded by epitaxial growth. Thus, for example, compared to a case in which ion implantation is performed from a direction oblique to the sidewall of the gate trench, the p-type base region may be assuredly formed having along the sidewall of the gate trench, a portion that has a lower impurity concentration.

Further, according to the first embodiment, since the p-type base region and the p$^+$-type high-concentration base region are formed by epitaxial growth, compared to a case in which these regions are formed by ion implantation, the impurity concentration distributions of the p-type base region and the p$^+$-type high-concentration base region may each be made uniformed. As a result, a channel having favorable crystallinity is obtained, carrier mobility at the p-type base region and the p$^+$-type high-concentration base region increases, and since the channel resistance may be reduced, reduction of the ON resistance may be facilitated.

Further, according to the first embodiment, the trench having a wider width than that of the gate trench is formed at the same position in the horizontal direction as the gate trench whereby the structure in which the p$^+$-type high-concentration base region is arranged to sandwich the p-type base region with the gate insulating film at the sidewall of the gate trench may be easily obtained. Further, this structure of the present invention may be formed with the same degree of formation difficulty as Japanese Laid-Open Patent Publication No. 2011-023675 and does not require a reduction of the interval between gate trenches. Therefore, a structure that suppresses the spread of a depletion layer of holes spreading in the base region may be easily manufactured while establishing a suitable interval between gate trenches.

Figure 7:
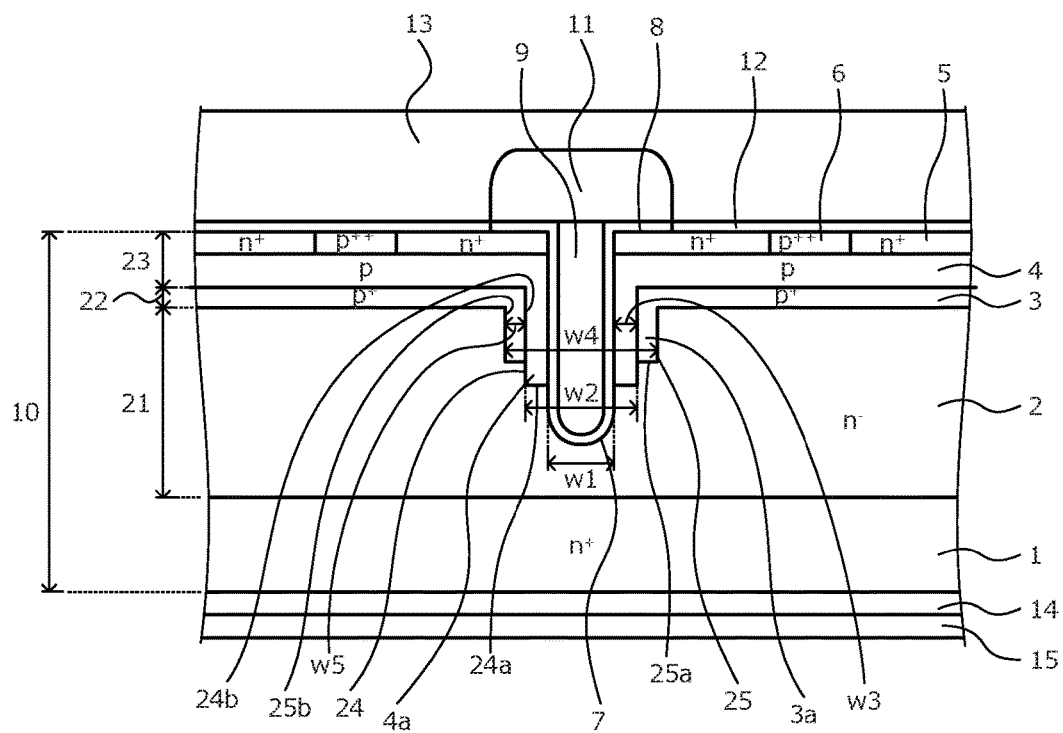
FIG. 7 is a cross-sectional view of a structure of the semiconductor device according to a second embodiment.

A structure of the semiconductor device according to a second embodiment is described. FIG. 7 is a cross-sectional view of a structure of the semiconductor device according to the second embodiment. The semiconductor device according to the second embodiment differs from the semiconductor device according to the first embodiment in that a portion of the $p^+$-type high-concentration base region 3 along the sidewall of the gate trench 7 extends along the sidewall of the gate trench 7, toward the drain region.

In particular, a first trench (second groove) 25 is provided in the $n^-$-type silicon carbide layer 21 at a predetermined depth from a surface on a first side of the $n^-$-type silicon carbide layer 21 opposite a second side of the $n^-$-type silicon carbide layer 21 facing the $n^+$-type starting substrate 1. The first trench 25 is arranged at a position that corresponds to the gate trench 7 in a direction parallel to the substrate front surface. The $p^+$-type silicon carbide layer 22 covers the $p^+$-type high-concentration base region 3 and is embedded in the first trench 25. Similar to the first embodiment, the $p^+$-type high-concentration base region 3 is a portion of the $p^+$-type silicon carbide layer 22 that is separated into plural regions by the trench (hereinafter, second trench) 24.

The second trench 24 is arranged at a position that corresponds to the gate trench 7 in a direction parallel to the substrate front surface. The second trench 24 penetrates, in the thickness direction, the $p^+$-type silicon carbide layer 22 embedded in the first trench 25 and reaches the $n^-$-type drift region 2 at a bottom 25a of the first trench 25. A bottom 24a of the second trench 24 is positioned at the same depth as that of the bottom 25a of the first trench 25 or at a position closer than the bottom 25a of the first trench 25 to the drain region. The width w2 of the second trench 24 is narrower than a width w4 of the first trench (w2<w4). A width w5 from a sidewall 24b of the second trench 24 to a sidewall 25b of the first trench 25 may be, for example, about 0.5 μm to 3.0 μm. The reason for this is that, by setting the width w5 to be 0.5 μm or more, a product of the impurity concentration of the $p^+$-type high-concentration base region 3 and the width w5 does not become less than a product of the impurity concentration of the p-type base region 4 and the width w3, and regarding formation, sufficient positioning and control of the pattern width may be performed by a photolithography process. Further, the width w5 from the sidewall 24b of the second trench 24 to the sidewall 25b of the first trench 25 being 3.0 μm or less is determined by the cell pitch.

Similar to the first embodiment, the p-type silicon carbide layer 23 covers the $p^+$-type high-concentration base region 3 and is embedded in the second trench 24. Similar to the first embodiment, the p-type base region 4, the $n^+$-type source region 5, and the $p^{++}$-type contact region 6 are arranged in the p-type silicon carbide layer 23. The gate trench 7, from the substrate front surface, penetrates the $n^+$-type source region 5 and the p-type base region 4 in the second trench 24 and reaches the $n^-$-type drift region 2 at the bottoms 25a, 24a of the first and second trenches 25, 24. The $p^+$-type high-concentration base region 3 extends along the sidewall of the gate trench 7, toward the drain region, covering the p-type base region 4 (4a) by a portion (portion embedded in the first trench 25) 3a that extends.

In other words, the portion 3a of the $p^+$-type high-concentration base region 3 extending along the sidewall of the gate trench 7 toward the drain region covers a portion (portion embedded in the second trench 24) 4a of the p-type base region 4 extended along the sidewall of the gate trench 7 toward the drain region, the portion 3a covering the portion 4a from a direction orthogonal to the substrate front surface. Therefore, even when the gate trench 7 and the second trench 24 are formed relatively deep, at the bottom side of the gate trench 7, the $p^+$-type high-concentration base region 3 may be arranged so as to sandwich the p-type base region 4 (4a) with the gate trench 7. The sidewall 24b of the second trench 24 is arranged in a rectangular planar layout surrounding a periphery of the gate trench 7. The sidewall 25b of the first trench 25 is arranged in a rectangular planar layout surrounding a periphery of the second trench 24.

The method of manufacturing a semiconductor device according to the second embodiment is described. FIGS. 8, 9, 10, 11, 12, and 13 are cross-sectional views of the semiconductor device according to the second embodiment during manufacture. First, similar to the first embodiment, the $n^-$-type starting substrate 1 is prepared and the $n^-$-type silicon carbide layer 21 that becomes the $n^-$-type drift region 2 is formed on the front surface of the $n^+$-type starting substrate 1, by epitaxial growth. Next, an etching mask (not depicted) having an opening that corresponds to a formation region of the first trench 25 is formed on the surface of the $n^-$-type silicon carbide layer 21, by a photolithography technique. As the etching mask, for example, a silicon oxide film mask may be used.

Figure 8:
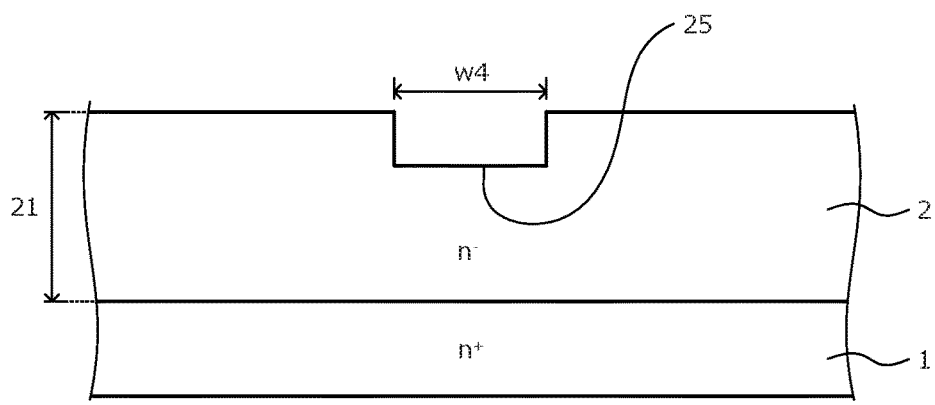
FIGS. 8, 9, 10, 11, 12, and 13 are cross-sectional views of the semiconductor device according to the second embodiment during manufacture.

Next, etching is performed using the etching mask as a mask whereby the first trench 25 is formed at a predetermined depth. Conditions of this etching may be the same as those for the second trench 24 described hereinafter. The width w4 of the first trench is sum of the width w2 of the second trench 24 formed in the first trench 25 at a subsequent process and twice the thickness (corresponds to the width w5) of the $p^+$-type high-concentration base region 3 remaining on the sidewall of the first trench 25 after formation of the second trench 24 (w4=w2+2×w5). The etching mask used in forming the first trench 25 is removed. The state up to here is depicted in FIG. 8.

Figure 9:
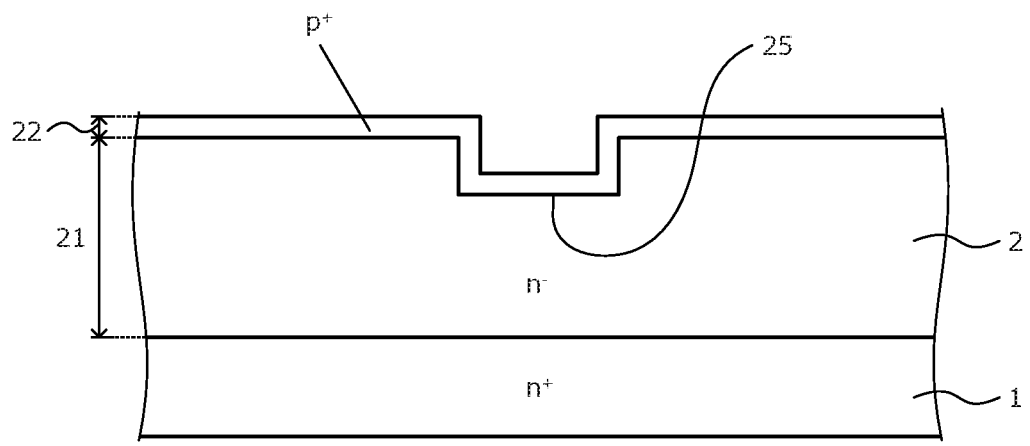

Next, on the surface of the $n^-$-type silicon carbide layer 21 and along the inner wall of the first trench 25, the $p^+$-type silicon carbide layer 22 is formed by epitaxial growth. At this time, the $p^+$-type silicon carbide layer 22 is formed by epitaxial growth so that a portion of the $p^+$-type silicon carbide layer 22 along the sidewall 25b of the first trench 25 has a predetermined thickness (corresponds to the width w5) or more. Conditions of the epitaxial growth for the $p^+$-type silicon carbide layer 22 may be the same as those for the first embodiment. The state up to here is depicted in FIG. 9.

Figure 10:
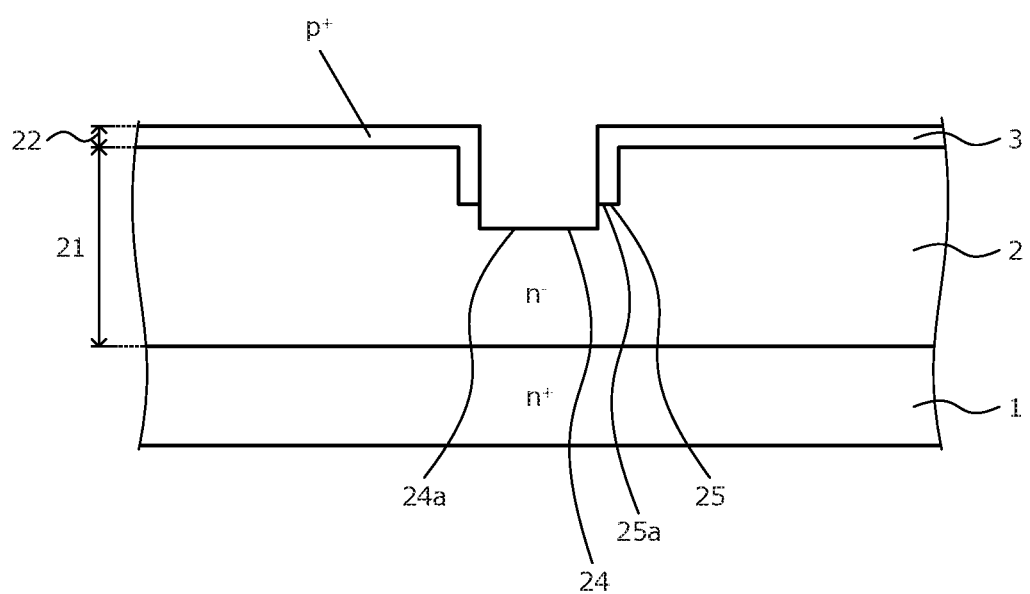
Figure 11:
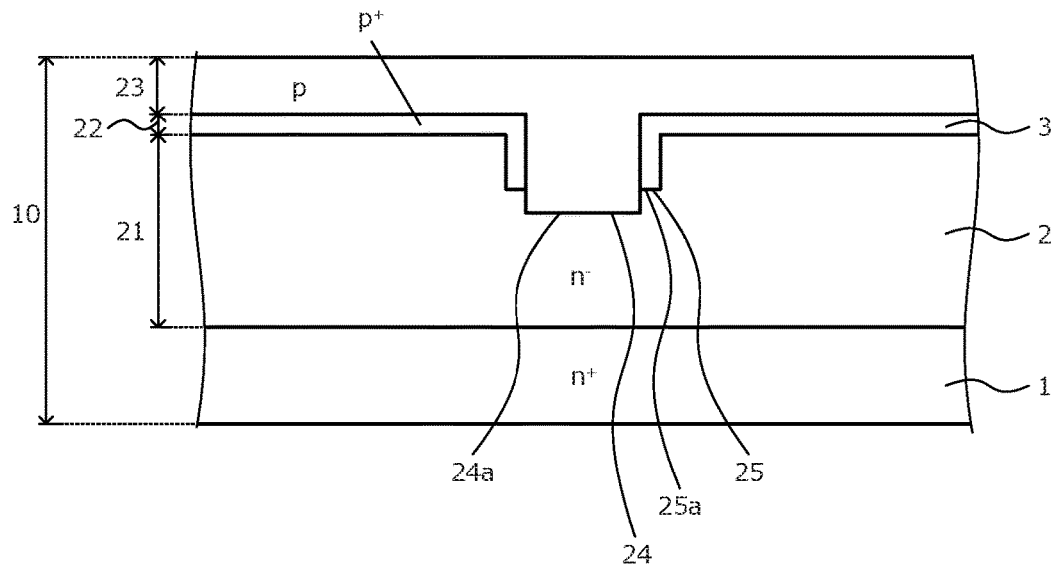

Next, similar to the first embodiment, the second trench 24 is formed penetrating the $p^+$-type silicon carbide layer 22 in the thickness direction to reach the $n^-$-type silicon carbide layer 21. At this time, the second trench 24 is formed in the first trench 25 and the $p^+$-type silicon carbide layer 22 is removed at the bottom 25a of the first trench 25, exposing the $n^-$-type drift region 2 at the bottom 24a of the second trench 24. The state up to here is depicted in FIG. 10.

Figure 12:
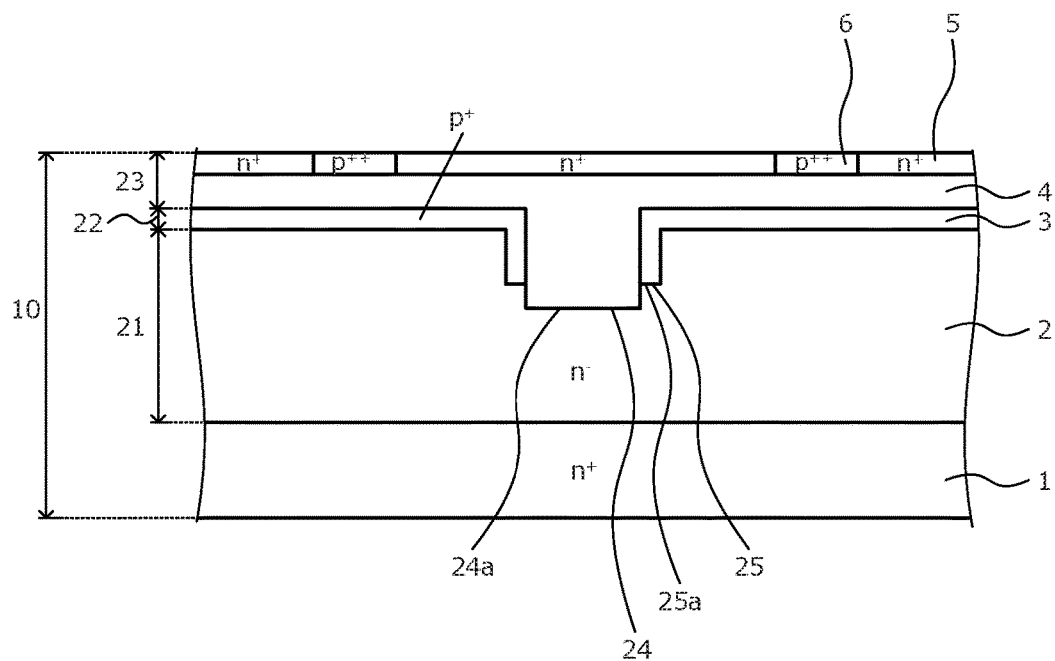
Figure 13:
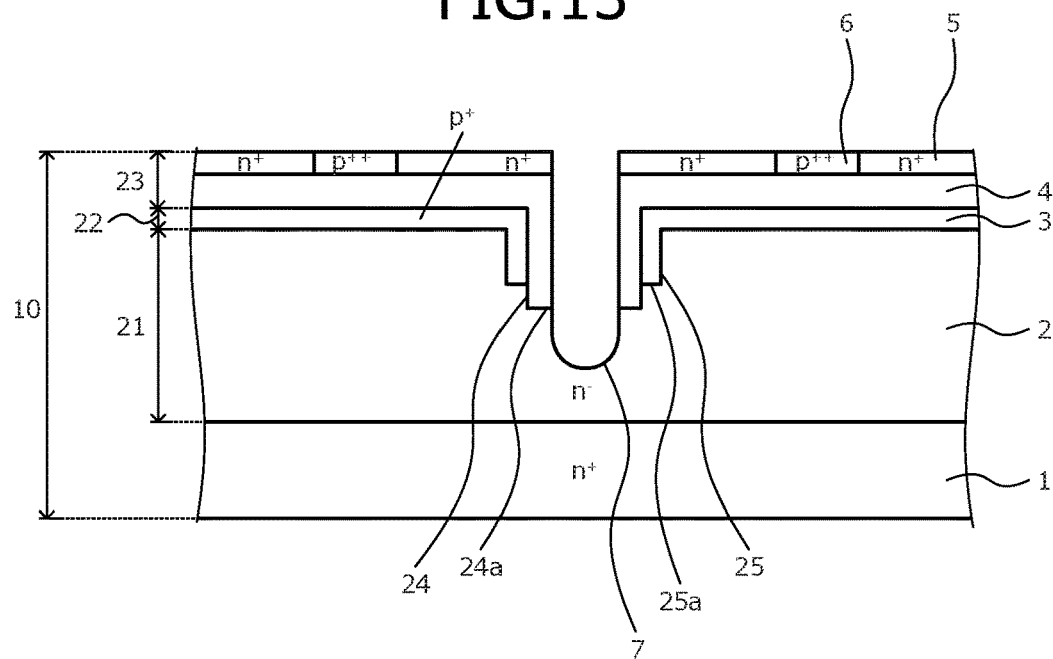

Next, similar to the first embodiment, the p-type silicon carbide layer 23 is formed on the surface of the $p^+$-type silicon carbide layer 22 and in the second trench 24, by epitaxial growth (FIG. 11) and thereafter, the $n^+$-type source region 5 and the $p^{++}$-type contact region 6 are each selectively formed in the p-type silicon carbide layer 23 (FIG. 12). Next, similar to the first embodiment, the gate trench 7 is formed penetrating the n$^+$-type source region 5 and the p-type base region 4 in the second trench 24 to reach the n$^-$-type drift region 2 (FIG. 13). Thereafter, similar to the first embodiment, activation annealing and subsequent processes are sequentially performed whereby the SiC-vertical MOSFET depicted in FIG. 7 is completed.

As described, according to the second embodiment, effects identical to those of the first embodiment may be obtained. Further, according to the second embodiment, irrespective of the depth of the gate trench, at the bottom side of the gate trench, the p-type base region is covered by the p$^+$-type high-concentration base region from a direction orthogonal to the substrate front surface.

Figure 14:
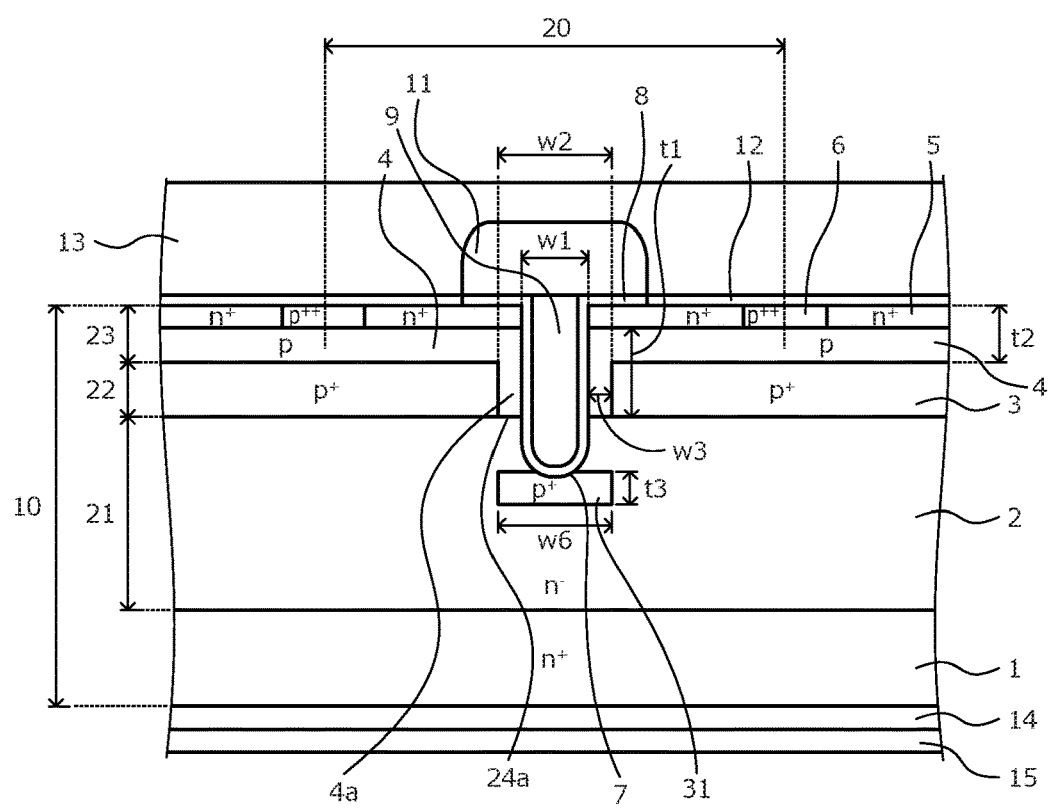
FIG. 14 is a cross-sectional view of a structure of the semiconductor device according to a third embodiment.

A structure of the semiconductor device according to a third embodiment is described. FIG. 14 is a cross-sectional view of a structure of the semiconductor device according to the third embodiment. The semiconductor device according to the third embodiment differs from the semiconductor device according to the first embodiment in that in the n$^-$-type drift region 2, a p$^+$-type region (second semiconductor region) 31 covering at least a portion of the bottom of the gate trench 7 is provided. In other words, the gate trench 7 reaches the n$^-$-type drift region 2 from substrate front surface and reaches the p$^+$-type region 31 in the n$^-$-type drift region 2.

The p$^+$-type region 31 is arranged to be separate from the p-type base region 4 and the p$^+$-type high-concentration base region 3. The p$^+$-type region 31 may partially contact the p-type base region 4 or the p$^+$-type high-concentration base region 3. Although not depicted, for example, a contacting location in the longitudinal direction may be created or the p$^+$-type region 31 may partially contact both the p-type base region 4 and the p$^+$-type high-concentration base region 3. The p$^+$-type region 31 may preferably cover the entire bottom of the gate trench 7. In other words, a width of w6 the p$^+$-type region 31 may be preferably wider than the width w1 of the gate trench 7 (w6>w1). An impurity concentration of the p$^+$-type region 31 is higher than the impurity concentration of the p-type base region 4. The p$^+$-type region 31 has a function of mitigating the electric field at the bottom of the gate trench 7 and maintaining the breakdown voltage when the MOSFET is OFF.

Further, the p$^+$-type region 31 has, for example, a uniform thickness t3 and is arranged in a linear planar layout parallel to a direction (longitudinal direction of the gate trench 7) in which the gate trench 7 having striped (linear) shape extends. In other words, the p$^+$-type region 31 is continuous in the longitudinal direction of the gate trench 7 and covers the bottom of the gate trench 7. Further, the p$^+$-type region 31 may be arranged at positions at predetermined intervals in the longitudinal direction of the gate trench 7. In other words, the bottom of the gate trench 7 may be partially covered by the p$^+$-type region 31.

The method of manufacturing a semiconductor device according to the third embodiment is described. First, similar to the first embodiment, the n$^+$-type starting substrate 1 is prepared and a first n$^-$-type silicon carbide layer is formed on the front surface of the n$^+$-type starting substrate 1 by epitaxial growth. The first n$^-$-type silicon carbide layer is a portion of the n$^-$-type silicon carbide layer 21 that becomes the n$^-$-type drift region 2. Next, an ion implantation mask (not depicted) having an opening that corresponds to a formation region of the p$^+$-type region 31 is formed on the surface of the first n$^-$-type silicon carbide layer, by a photolithography technique. As the ion implantation mask, for example, an oxide film mask may be used.

Next, for example, a p-type impurity such as aluminum is ion implanted using the ion implantation mask as a mask. The ion implantation mask used in forming the p$^+$-type region 31 is removed. Next, the second n$^-$-type silicon carbide layer is formed on the first n$^-$-type silicon carbide layer, by epitaxial growth whereby the n$^-$-type silicon carbide layer 21 in which the first and second n$^-$-type silicon carbide layers are sequentially stacked is formed. As a result, the p$^+$-type region 31 is selectively formed in the n$^-$-type silicon carbide layer 21, away from the surface (an interface with the p$^+$-type silicon carbide layer 22 formed at a subsequent process) of the n$^-$-type silicon carbide layer 21.

The thickness t3 of the p$^+$-type region 31 may be, for example, about 0.5 μm. The thickness t3 of the p$^+$-type region 31 is the thickness of the p$^+$-type region 31 before formation of the gate trench 7. Thereafter, similar to the first embodiment, formation of the p$^+$-type silicon carbide layer 22 by epitaxial growth and subsequent processes are sequentially performed. At this time, in the formation of the gate trench 7 (refer to FIG. 6), the gate trench 7 is formed so that at least a portion of the bottom of the gate trench 7 is positioned in the p$^+$-type region 31. Thus, the SiC-vertical MOSFET depicted in FIG. 14 is completed.

The third embodiment may be applied to the second embodiment.

As described, according to the third embodiment, effects identical to those of the first and second embodiments may be obtained. Further, according to the third embodiment, the p$^+$-type region covering at least a portion of the bottom of the gate trench is provided whereby the concentration of electric field at the bottom of the gate trench may be mitigated.

The present invention is not limited to the embodiments above and various modifications within a scope not deviating from the spirit of the invention are possible. For example, in the method of manufacturing according to the embodiments described above, as an example, a case in which the front surface of the silicon carbide substrate is assumed as a Si face and the sidewall of the gate trench is assumed as an m face has been described, without limitation hereto, the orientation of the sidewall of the trench gate, the front surface of the silicon carbide substrate, etc. may be various changed. Further, the sidewall of the gate trench may be sloped with respect to the substrate front surface so that the width of the gate trench increases from the bottom toward the opening.

In the embodiments, although description has been given taking a MOSFET as an example, the present invention is not limited hereto and, for example, is applicable to a MOS-type semiconductor device such as insulated gate bipolar transistor (IGBT). Further, in the embodiments, although description has been given taking, as an example, a case in which silicon carbide is used as a wide bandgap semiconductor, the present invention is applicable to a wide bandgap semiconductor other than silicon carbide, such as, for example, gallium nitride (GaN). The present invention is similarly implemented when the conductivity types (n-type, p-type) are reversed.

However, a problem arises with the conventional techniques in that when a portion of the p-type base region along the trench sidewall has a low impurity concentration or as described in Japanese Patent No. 4678902, when an inverted n-type structure is formed by ion implantation, in the ion implantation of an n-type impurity from a direction perpendicular to the substrate front surface, the amount of the n-type impurity implanted into the trench sidewall may be low or the depth of the implanted n-type impurity may be shallow. Therefore, to ensure the implanted amount and depth of the n-type impurity, the n-type impurity has to be ion implanted into the trench sidewall from a direction oblique to the substrate front surface. However, the ion implantation is performed by changing the implantation angle for each sidewall of the trench whereby a new problem arises in that the number of ion implantation sessions increases.

Further, in Japanese Patent No. 4678902, the n-type impurity concentration at the trench bottom is increased by providing an n-type region along the trench bottom. Therefore, when the MOSFET is OFF, the concentration of electric field at the trench bottom becomes strong whereby dielectric breakdown of a portion of the gate insulating film along the trench bottom may reduce the breakdown voltage. In Japanese Laid-Open Patent Publication No. 2011-023675, formation of a MOS gate structure at a portion between trenches is difficult.

According the present invention, when gate voltage is applied, the spreading of a channel is suppressed. As a result, when reversed voltage (positive voltage is applied to the first semiconductor layer and negative voltage is applied to the third semiconductor layer), punchthrough at the channel (a phenomenon in which the second and third semiconductor layers are completely depleted by the channel) may be prevented. Further, a predetermined gate threshold voltage may be suitably set according to the impurity concentration of the second semiconductor layer.

Further, according to the present invention, for example, as compared to a case in which ion implantation is performed from a direction oblique to the sidewall of the trench, the second semiconductor layer may be arranged assuredly having along the sidewall of the trench, a portion that has a lower impurity concentration. Further, the first groove having a width wider than that of the trench is formed at the same position as that of the trench whereby the second semiconductor layer having a relatively higher impurity concentration may be assuredly arranged so as to sandwich the third semiconductor layer with the gate insulating film at the sidewall of the trench.

The semiconductor device and the method of manufacturing a semiconductor device according to the present invention achieve an effect in that easy manufacturing is enabled and a predetermined gate threshold voltage may be set with the breakdown voltage maintained as is.

As described, the semiconductor device and the method of manufacturing a semiconductor device according to the present invention are useful for, for example, semiconductor devices used in power converting equipment and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a semiconductor substrate containing a wide bandgap semiconductor material having a bandgap wider than that of silicon;
   a first semiconductor layer of a first conductivity type provided on a front surface of the semiconductor substrate and containing the wide bandgap semiconductor material;
   a second semiconductor layer of a second conductivity type provided on a surface on a first side of the first semiconductor layer opposite a second side of the first semiconductor layer facing the semiconductor substrate, the second semiconductor layer containing the wide bandgap semiconductor material;
   a first groove penetrating both surfaces of the second semiconductor layer in a thickness direction and reaching the first semiconductor layer wherein the first groove extends to the surface of the first semiconductor layer on the first side thereof;
   a third semiconductor layer of the second conductivity type provided on a surface on a first side of the second semiconductor layer opposite a second side of the second semiconductor layer facing the first semiconductor layer, the third semiconductor layer lining the first groove, an impurity concentration of the third semiconductor layer lower than that of the second semiconductor layer, the third semiconductor layer containing the wide bandgap semiconductor material;
   a first semiconductor region of the first conductivity type selectively provided in the third semiconductor layer;
   a trench penetrating, in the thickness direction, the third semiconductor layer in the first groove and the first semiconductor region to reach the first semiconductor layer, a width of the trench narrower than that of the first groove;
   a gate insulating film provided along an inner wall of the trench;
   a gate electrode provided on the gate insulating film in the trench;
   a first electrode electrically connected to the first semiconductor region and the third semiconductor layer; and
   a second electrode electrically connected to a rear surface of the semiconductor substrate.

2. The semiconductor device according to claim 1, wherein
   the second semiconductor layer and the gate insulating film are separated by the third semiconductor layer.

3. The semiconductor device according to claim 1, comprising
   a second groove provided at a predetermined depth from the surface on the first side of the first semiconductor layer in the thickness direction, a width of the second groove wider than that of the first groove, wherein
   the second semiconductor layer lines a side of the second groove, and
   the first groove penetrates the second semiconductor layer in the second groove, in the thickness direction, from the surface on the first side of the second semiconductor layer and reaches the first semiconductor layer.

4. The semiconductor device according to claim 1, comprising
   a second semiconductor region of the second conductivity type provided in the first semiconductor layer separately from the second semiconductor layer and the third semiconductor layer, the second semiconductor region covering at least a portion of a bottom of the trench, an impurity concentration of the second semiconductor region higher than that of the third semiconductor layer.

5. The semiconductor device according to claim 1, wherein
   the second semiconductor layer is an epitaxial layer.

6. The semiconductor device according to claim 1, wherein
   the third semiconductor layer is an epitaxial layer.

7. The semiconductor device according to claim 1, wherein the wide bandgap semiconductor material is silicon carbide.

8. A method of manufacturing a semiconductor device, the method comprising:
- depositing a first epitaxial layer of a first conductivity type on a front surface of a semiconductor substrate containing a semiconductor material having a bandgap wider than that of silicon;
- depositing a second epitaxial layer of a second conductivity type on the first epitaxial layer;
- forming a first groove penetrating both surfaces of the second epitaxial layer in a thickness direction and reaching the first epitaxial layer wherein the first groove extends to a surface of the first epitaxial layer without penetrating the first epitaxial layer;
- depositing a third epitaxial layer of the second conductivity type on the second epitaxial layer and in the first groove, an impurity concentration of the third epitaxial layer lower than that of the second epitaxial layer;
- selectively forming a first semiconductor region of the first conductivity type in the third epitaxial layer;
- forming a trench penetrating, in the thickness direction, the first semiconductor region and the third epitaxial layer in the first groove and reaching the first epitaxial layer, a width of the trench narrower than that of the first groove;
- forming a gate insulating film along an inner wall of the trench;
- forming a gate electrode on the gate insulating film in the trench;
- forming a first electrode on the first semiconductor region and electrically connected to the first semiconductor region and the third epitaxial layer; and
- forming a second electrode electrically connected to a rear surface of the semiconductor substrate.

9. The method of manufacturing a semiconductor device according to claim 8, comprising
- forming a second groove after depositing the first epitaxial layer and before depositing the second epitaxial layer, the second groove formed in the first epitaxial layer at a predetermined depth in the thickness direction, a width of the second groove wider than that of the first groove, wherein
- the second epitaxial layer is deposited in the second groove, and
- the first groove is formed to penetrate, in the thickness direction, the second epitaxial layer in the second groove from a surface of the second epitaxial layer and reach the first epitaxial layer.

10. The method of manufacturing a semiconductor device according to claim 8, comprising
- forming a second semiconductor region of the second conductivity type after depositing the first epitaxial layer and before depositing the second epitaxial layer, the second semiconductor region formed in the first epitaxial layer, an impurity concentration of the second semiconductor region higher than that of the third epitaxial layer, wherein
- the trench is formed so that at least a portion of a bottom of the trench reaches the second semiconductor region.

11. The method of manufacturing a semiconductor device according to claim 8, wherein
the semiconductor material having a bandgap wider than that of silicon is silicon carbide.

* * * * *